United States Patent
Larsen et al.

(10) Patent No.: US 10,060,993 B2
(45) Date of Patent: *Aug. 28, 2018

(54) COMBINED ELECTRON PARAMAGNETIC RESONANCE (EPR) AND NUCLEAR MAGNETIC RESONANCE (NMR) MAGNETOMETER SYSTEM

(71) Applicants: Michael S. Larsen, Woodland Hills, CA (US); Robert C. Griffith, Woodland Hills, CA (US); Michael D. Bulatowicz, Canoga Park, CA (US); Philip R. Clark, Tarzana, CA (US)

(72) Inventors: Michael S. Larsen, Woodland Hills, CA (US); Robert C. Griffith, Woodland Hills, CA (US); Michael D. Bulatowicz, Canoga Park, CA (US); Philip R. Clark, Tarzana, CA (US)

(73) Assignee: Northrop Grumman Guidance and Electronics Company, Inc., Woodland Hills, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/474,433

(22) Filed: Mar. 30, 2017

(65) Prior Publication Data
US 2017/0205476 A1 Jul. 20, 2017

Related U.S. Application Data

(63) Continuation of application No. 13/711,199, filed on Dec. 11, 2012, now Pat. No. 9,645,205.

(51) Int. Cl.
*G01V 3/00* (2006.01)
*G01R 33/26* (2006.01)
(Continued)

(52) U.S. Cl.
CPC .......... *G01R 33/26* (2013.01); *G01R 33/032* (2013.01); *G01R 33/443* (2013.01); *G01R 33/60* (2013.01)

(58) Field of Classification Search
CPC ...................................... G01R 33/26
(Continued)

(56) References Cited

U.S. PATENT DOCUMENTS

| 4,492,923 A | 1/1985 | Byram |
| 4,814,707 A | 3/1989 | Marton |

(Continued)

FOREIGN PATENT DOCUMENTS

WO    WO 2010/017318 A2    2/2010

OTHER PUBLICATIONS

Article "Compact Atomic Magnetometer for Global Navigation" Bulatowicz et al., Apr. 2012, pp. 1088-1093.

(Continued)

*Primary Examiner* — Louis Arana
(74) *Attorney, Agent, or Firm* — Tarolli, Sundheim, Covell, & Tummino LLP

(57) ABSTRACT

One embodiment of the invention includes a magnetometer system. The system includes a sensor cell comprising alkali metal particles and a probe laser configured to provide a probe beam through the sensor cell. The system also includes a detection system configured to implement nuclear magnetic resonance (NMR) detection of a vector magnitude of an external magnetic field in a first of three orthogonal axes based on characteristics of the probe beam passing through the sensor cell and to implement electron paramagnetic resonance (EPR) detection of a vector magnitude of the external magnetic field in a second and a third of the three orthogonal axes based on the characteristics of the probe beam passing through the sensor cell. The system further (Continued)

includes a controller configured to calculate a scalar magnitude of the external magnetic field based on the magnitude of the external magnetic field in each of the three orthogonal axes.

20 Claims, 3 Drawing Sheets

(51) Int. Cl.
    *G01R 33/032*     (2006.01)
    *G01R 33/60*     (2006.01)
    *G01R 33/44*     (2006.01)

(58) Field of Classification Search
    USPC .......................................... 324/304, 305, 301
    See application file for complete search history.

(56) References Cited

U.S. PATENT DOCUMENTS

| | | | |
|---|---|---|---|
| 6,269,324 B1 | 7/2001 | Rakijas et al. | |
| 6,292,758 B1 | 9/2001 | Gilbert et al. | |
| 6,313,628 B1 | 11/2001 | Leger | |
| 6,476,610 B1 | 11/2002 | Wiegert et al. | |
| 6,800,913 B2 | 10/2004 | Johnson et al. | |
| 6,884,726 B2 | 1/2005 | Leger et al. | |
| 6,888,353 B1 | 5/2005 | Wiegert | |
| 7,064,542 B2 | 6/2006 | Johnson et al. | |
| 8,773,120 B2 | 7/2014 | Jager | |
| 2010/0102809 A1 | 4/2010 | May | |
| 2010/0289491 A1* | 11/2010 | Budker | G01R 33/26 324/304 |
| 2014/0184216 A1* | 7/2014 | Walker | G01C 19/62 324/305 |
| 2016/0116553 A1* | 4/2016 | Kim | G01R 33/26 324/305 |
| 2016/0202062 A1* | 7/2016 | Griffith | G01R 33/26 324/304 |

OTHER PUBLICATIONS

Article "Unshielded Three-axis Vector Operation of a Spin-Exchange-Relaxation Free Automatic Magnetometer", Nov. 2004, pp. 4804-4806.

* cited by examiner

COMBINED ELECTRON PARAMAGNETIC RESONANCE (EPR) AND NUCLEAR MAGNETIC RESONANCE (NMR) MAGNETOMETER SYSTEM

RELATED APPLICATIONS

This application claims priority from U.S. patent application Ser. No. 13/711,199, filed 11 Dec. 2012, which is incorporated herein in its entirety.

TECHNICAL FIELD

The present invention relates generally to sensor systems, and specifically to a combined EPR and NMR magnetometer system.

BACKGROUND

Magnetometer systems, such as nuclear magnetic resonance (NMR) magnetometers and/or electron paramagnetic resonance (EPR) magnetometers, can include a cell that contains one or more alkali metal vapors, such as rubidium or cesium, which can exhibit precession characteristics that can be a function of an external magnetic field. Thus, the magnetometer system can be configured to detect the external magnetic field based on the precession characteristics of the alkali metal vapor(s). Typical magnetometer systems that implement detection of the external magnetic field in three vector axes implement a combination of multiple single-axis or dual-axis vector systems. Such magnetometer systems can typically exhibit sensitivities to dynamics or system misalignments when attempting to determine a whole field scalar measurement, which can result in inaccuracy. Thus, when high sensitivity and stability may be required in a dynamic environment, whole field scalar magnetometer systems are often implemented. However, such whole field scalar magnetometer systems cannot provide multi-axis measurements and typically exhibit a low-bandwidth in providing dynamic measurements.

SUMMARY

One embodiment of the invention includes a magnetometer system. The system includes a sensor cell comprising alkali metal particles and a probe laser configured to provide a probe beam through the sensor cell. The system also includes a detection system configured to implement nuclear magnetic resonance (NMR) detection of a vector magnitude of an external magnetic field in a first of three orthogonal axes based on characteristics of the probe beam passing through the sensor cell and to implement electron paramagnetic resonance (EPR) detection of a vector magnitude of the external magnetic field in a second and a third of the three orthogonal axes based on the characteristics of the probe beam passing through the sensor cell. The system further includes a controller configured to calculate a scalar magnitude of the external magnetic field based on the magnitude of the external magnetic field in each of the three orthogonal axes.

Another embodiment of the invention includes a method for measuring both a scalar magnitude and a vector magnitude of an external magnetic field in three orthogonal axes. The method includes applying a first magnetic field along a first axis of three orthogonal axes, the first magnetic field being configured to cause alkali metal particles in a sensor cell to precess. The method also includes providing a probe beam through the sensor cell and detecting characteristics of precession of the alkali metal particles responsive to an external magnetic field based on characteristics of the probe beam through the sensor cell. The method also includes controlling a magnitude of a second magnetic field and a third magnetic field in a second axis and a third axis, respectively, of the three orthogonal axes in a feedback manner to substantially counteract the external magnetic field based on the characteristics of the precession of the alkali metal particles. The method also includes monitoring precession of at least one nuclear spin isotope in the sensor cell and controlling a magnitude of the first magnetic field along the first axis to maintain a substantially constant precession of the at least one nuclear spin isotope in a feedback manner. The method further includes calculating both a vector magnitude and a scalar magnitude of the external magnetic field based on the magnitude of the first, second, and third magnetic fields.

Another embodiment of the invention includes a magnetometer system. The system includes a sensor cell comprising alkali metal particles, a probe laser configured to provide a probe beam through the sensor cell, and a pump laser configured to generate an optical pump beam configured to stimulate the alkali metal particles. The system also includes a magnetic field system configured to generate a controllable magnetic field in each of three orthogonal axes through the sensor cell. The system also includes a detection system configured to detect characteristics of precession of the stimulated alkali metal particles responsive to an external magnetic field based on the probe beam and to control a magnitude of the controllable magnetic field in each of the three orthogonal axes in a feedback manner to substantially counteract the external magnetic field based on the characteristics of the precession of the stimulated alkali metal particles. The system further includes a controller configured to calculate both a vector magnitude and a scalar magnitude of the external magnetic field based on the magnitude of the controllable magnetic field in each of the three orthogonal axes.

DETAILED DESCRIPTION

Figure 1:
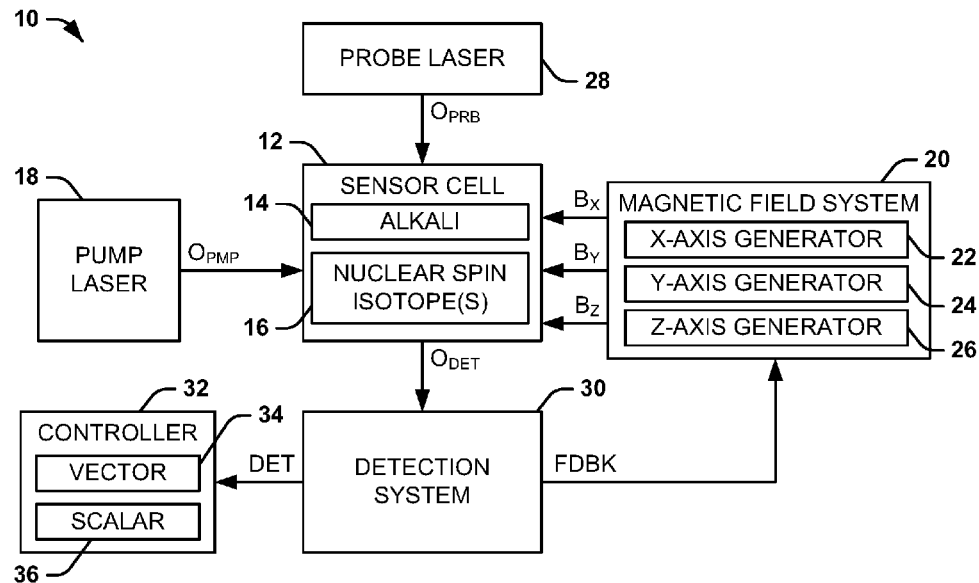
FIG. 1 illustrates an example of a magnetometer system in accordance with an aspect of the invention.

The present invention relates generally to sensor systems, and specifically to a combined electron paramagnetic resonance (EPR) and nuclear magnetic resonance (NMR) magnetometer system. A magnetometer system can include a sensor cell that includes alkali metal particles and at least one nuclear spin isotope. As an example, the alkali metal can be rubidium (Rb) or cesium (Cs), and the at least one nuclear spin isotope can be one or more xenon (Xe) isotopes. The system can include a magnetic field system that is configured to generate magnetic fields in each of the three orthogonal axes. In response to a first magnetic field, the alkali metal particles can be stimulated to precess in the sensor cell, along with the nuclear spin isotope(s) based on optical pumping of the alkali metal particles by an optical pump beam. The precession of the alkali metal particles can exhibit characteristics that are based in part on an external magnetic field, in that the precession can be about a total net DC magnetic field that is applied to the sensor cell. As described herein, the term "external magnetic field" refers to a magnetic field that is provided external to the magnetometer system, and thus corresponds to a magnetic field that is to be measured by the magnetometer system. Therefore, the magnetometer system can include a probe laser configured to provide a probe beam through the sensor cell, such that a Faraday rotation of the probe beam can be indicative of the characteristics of the precession of the alkali metal particles. In response, the magnetic field generator can be configured to control a magnetic field in each of two of the three orthogonal axes to substantially cancel out the external magnetic field in the two axes in a feedback manner based on the characteristics of the precession of the alkali metal particles. As a result, the remaining component of the external magnetic field is aligned with the third orthogonal axis. Accordingly, a magnitude of the external magnetic field can be measured in the two axes based on the controlled magnetic fields in an EPR manner.

The probe beam can also be implemented to determine a precession frequency of the nuclear spin isotope(s) based on a net effect of a magnetic field internal to the sensor cell upon the alkali metal particles. Upon determining the precession frequency of the nuclear spin isotope(s), the precession frequency can be compared with a substantially stable frequency reference, such as generated from a local oscillator. Because the precession of the nuclear spin isotope(s) depends on the net magnetic field in the third axis, the magnetic field system can be configured to control the magnetic field in the third axis to set the precession frequency approximately equal to the reference frequency in a feedback manner. Therefore, the magnitude of the external magnetic field can be measured in the third axis in an NMR manner, thus allowing measurement of the external magnetic field in the three orthogonal axes in a single sensor cell magnetometer system. A scalar magnitude of the external magnetic field can thus be calculated based on a vector sum of the vector components of the external magnetic field in the three orthogonal axes.

FIG. 1 illustrates an example of a magnetometer system 10 in accordance with an aspect of the invention. In the example of FIG. 1, the magnetometer system 10 can implement measurement characteristics of both an electron paramagnetic resonance (EPR) magnetometer and a nuclear magnetic resonance (NMR) magnetometer using a single sensor cell 12. The magnetometer system 10 can be implemented in any of a variety of applications that may require measurement of external and applied magnetic fields.

The sensor cell 12 can be, for example, a glass casing of any of a variety of shapes and sizes. The sensor cell 12 includes an alkali metal 14, as well as one or more nuclear spin isotopes 16. As an example, the alkali metal 14 can be rubidium (Rb) vapor, such as $^{85}Rb$, or cesium (Cs) vapor, such as $^{133}Cs$, and the nuclear spin isotope(s) 16 can include noble gas isotopes such as helium (He), krypton (Kr), or xenon (Xe) (e.g., $^{3}He$, $^{83}Kr$, $^{129}Xe$, and/or $^{131}Xe$). The magnetometer system 10 includes a pump laser 18 that is configured to generate an optical pump beam $O_{PMP}$ that is directed through the sensor cell 12 via a set of optics to stimulate (i.e., excite) the particles of the alkali metal 14 to an excited state. The excited particles of the alkali metal 14 can precess in the sensor cell 12 in response to an applied AC magnetic field, such as with the nuclear spin isotopes 16. In the example of FIG. 1, the magnetometer system 10 includes a magnetic field system 20 that is configured to generate magnetic fields in each of three orthogonal axes. Specifically, the magnetic field system includes an X-axis magnetic field generator 22 that generates a magnetic field $B_X$, a Y-axis magnetic field generator 24 that generates a magnetic field $B_Y$, and a Z-axis magnetic field generator 26 that generates a magnetic field $B_Z$. As an example, the magnetic field $B_Z$ can be an AC magnetic field having a DC component (i.e., DC offset) in the Z-axis, which can be substantially collinear with the pump beam $O_{PMP}$. Thus, the particles of the alkali metal 14 can precess in response to the magnetic field $B_Z$.

The precession of the particles of the alkali metal 14 can be about an axis that corresponds to a net DC magnetic field, including an external magnetic field which the magnetometer system 10 is configured to calculate. The magnetometer system 10 also includes a probe laser 28 configured to generate a probe beam $O_{PRB}$ that is directed through the sensor cell 12, such as approximately orthogonally with respect to the pump beam $O_{PMP}$. The probe beam exiting the sensor cell 12, demonstrated in the example of FIG. 1 as $O_{DET}$, can exhibit characteristics that correspond to the precession of the particles of the alkali metal 14. For example, due to the birefringence of the alkali metal 14, the angle of precession of the particles of the alkali metal 14 can exhibit a Faraday rotation on the probe beam $O_{DET}$. The probe beam $O_{DET}$ exiting the sensor cell 12 is provided to a detection system 30 that is configured to determine the Faraday rotation of the probe beam $O_{DET}$, which can be indicative of the components of the net magnetic field in the X/Y plane, which is substantially orthogonal to the pump beam $O_{PMP}$. Therefore, the detection system 30 can provide a feedback signal FDBK to the magnetic field system 20 to command the X-axis magnetic field generator 22 and the Y-axis magnetic field generator 24 to adjust the respective magnetic fields $B_X$ and $B_Y$ to substantially mitigate the Faraday rotation of the probe beam $O_{DET}$ in a feedback manner based on setting the components of the net magnetic field in the X/Y plane to approximately zero to align the net magnetic field to the Z-axis. Thus, the magnitudes of the magnetic fields $B_X$ and $B_Y$ correspond directly to the vector magnitudes of the external magnetic field in the respective X- and Y-axes. Accordingly, the magnetometer system 10 can implement EPR detection of the vector components of the external magnetic field in the X- and Y-axes based on determining characteristics of the precession of the particles of the alkali metal 14.

The vector magnitudes of the external magnetic field in the respective X- and Y-axes are provided to a controller 32 via a signal DET. The controller 32 has a vector component 34 and a scalar component 36, such that the controller 32 can calculate or otherwise provide the magnitude of the external magnetic field as both a vector magnitude in three orthogonal axes via the vector component 34 and as a scalar magnitude via the scalar component 36. As an example, the controller 32 can store and/or substantially constantly update the values of the vector magnitudes of the external magnetic field in the respective X- and Y-axes via the vector component 34.

Upon aligning the net magnetic field to the Z-axis based on counteracting the components of the external magnetic field in the X- and Y-axes via the magnetic fields $B_X$ and $B_Y$, the Z-axis magnetic field generator 26 can be configured to adjust a magnitude of the DC component of the magnetic field $B_Z$ to determine the magnitude of the external magnetic field in the Z-axis. Specifically, due to the excitation of the alkali metal 14 by the pump beam $O_{PMP}$, the alkali metal 14 polarizes the nuclear spin isotope(s) 16 based on collision of the alkali metal 14 with the nuclear spin isotope(s) 16 in a spin-exchange process. The nuclear spin isotope(s) 16 can thus be caused to precess about the Z-axis in response to magnetic fields in the X- and/or Y-axes at a corresponding Larmor precession frequency. Thus, at least one of the magnetic fields $B_X$ and $B_Y$ can include an AC component having a frequency that is approximately equal to a Larmor precession frequency of the nuclear spin isotope(s) 16, such that the nuclear spin isotope(s) 16 can be caused to precess.

Figure 2:
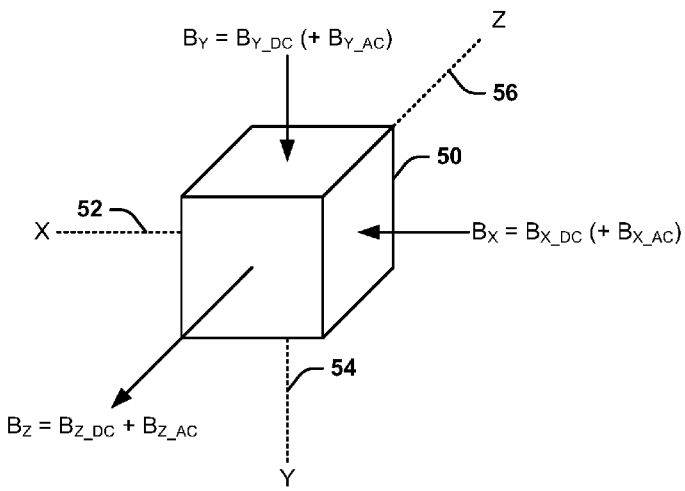
FIG. 2 illustrates an example of a sensor cell in accordance with an aspect of the invention.

FIG. 2 illustrates an example of a sensor cell 50 in accordance with an aspect of the invention. As an example, the sensor cell 50 can correspond to the sensor cell 12 in the example of FIG. 1, and thus, reference is to be made to the example of FIG. 1 in the following description of the example of FIG. 2. The sensor cell 50 is demonstrated in the example of FIG. 2, as being oriented with respect to the three orthogonal axes. Specifically, the example of FIG. 2 demonstrates the X-axis 52, the Y-axis 54, and the Z-axis 56. The example of FIG. 2 also demonstrates the magnetic fields acting upon each axis of the sensor cell 50. Specifically, the magnetic field $B_X$ is provided along the X-axis 52, and is demonstrated as including a DC component $B_{X\_DC}$ and possibly an AC component $B_{X\_AC}$. Similarly, the magnetic field $B_Y$ is provided along the Y-axis 54, and is demonstrated as including a DC component $B_{Y\_DC}$ and possibly an AC component $B_{Y\_AC}$. The magnetic field $B_Z$ is demonstrated as including both a DC component $B_{Z\_DC}$ and an AC component $B_{Z\_AC}$. It is to be understood that one of or both of the magnetic fields $B_X$ and $B_Y$ can include the respective AC components $B_{X\_AC}$ and $B_{Y\_AC}$.

Referring back to the example of FIG. 1, the precession of the nuclear spin isotope(s) 16 can thus generate an AC magnetic field internal to the sensor cell 12. The internal magnetic field can thus stimulate precession of the particles of the alkali metal 14 at the Larmor precession frequency of the alkali metal 14 with an amplitude that is modulated at the Larmor precession frequency of the nuclear spin isotope(s) 16. As a result, the probe beam $O_{DET}$ exiting the sensor cell 12 can include a Faraday rotation that corresponds in part to the precession of the alkali metal 14 at the Larmor precession frequency of the alkali metal 14 with an amplitude that is modulated at the Larmor precession frequency of the nuclear spin isotope(s) 16. The precession of the nuclear spin isotope(s) 16, and thus the particles of the alkali metal 14, can also be dependent on the magnitude of the vector component of the net magnetic field in the Z-axis. The detection system 30 can thus be configured to monitor the precession of the nuclear spin isotope(s) 16 based on the probe beam $O_{DET}$ exiting the sensor cell 12 as a result of the interaction of the probe beam $O_{PRB}$ with the alkali metal 14 to determine a magnitude of the net magnetic field in the Z-axis.

For example, the precession frequency of the nuclear spin isotope(s) 16 can be compared with a predetermined value corresponding to a magnitude of an external magnetic field (i.e., external to the magnetometer system 10), such as generated at a local oscillator. Therefore, a deviation of the precession frequency of the nuclear spin isotope(s) 16 from the predetermined value can be indicative of a magnitude and direction of the external magnetic field along the Z-axis. As another example, because physical rotation of the sensor cell 12 about the Z-axis can affect the measured precession frequency of the nuclear spin isotope(s) 16 relative to inertial space, the nuclear spin isotope(s) 16 can include two nuclear spin isotopes 16 that precess in opposite directions in response to the magnetic field $B_Z$. As a result, the precession frequencies of the two nuclear spin isotopes 16 are affected equally and oppositely in response to rotation of the sensor cell 12. Accordingly, a sum of the precession frequencies of the two nuclear spin isotopes 16 can be compared with the predetermined frequency value to determine the magnitude of the external magnetic field along the Z-axis. As such, the determination of the magnitude of the external magnetic field along the Z-axis can be insensitive to rotation of the sensor cell 12 about the Z-axis.

The detection system 30 can determine the precession frequency of the nuclear spin isotope(s) 16 based on a frequency of the Faraday rotation of the probe beam $O_{DET}$. The detection system 30 can distinguish the precession frequency of the Faraday rotation of the probe beam $O_{DET}$ based on disparate frequencies of the magnetic fields provided through the sensor cell 12. For example, the AC component $B_{Z\_AC}$ of the magnetic field $B_Z$ can be significantly different from the AC components $B_{X\_AC}$ and $B_{Y\_AC}$ of the respective one or both of the magnetic fields $B_X$ and $B_Y$ for stimulation of the precession of the alkali metal 14 relative to the precession of the nuclear spin isotope(s) 16. As one example, the AC component $B_{Z\_AC}$ can be approximately 50 kHz, whereas the AC components $B_{X\_AC}$ and $B_{Y\_AC}$ of the respective one or both of the magnetic fields $B_X$ and $B_Y$ can be approximately 50 Hz (e.g., approximately the natural precession frequency of Xe). Furthermore, the Faraday rotation of the probe beam $O_{DET}$ resulting from the components of the external magnetic field in the X/Y plane, as described previously, is based on DC or near DC magnetic fields, and thus has a frequency that is approximately zero.

Upon determining the precession frequency of the nuclear spin isotope(s) 16, the detection system 30 can compare the precession frequency with the predetermined value, such as generated from a substantially stable frequency reference, to determine an error between the values. The detection system 30 can thus adjust a magnitude of the DC component $B_{Z\_DC}$ of the magnetic field $B_Z$ via the signal FDBK to shift the precession frequency of the nuclear spin isotope(s) 16 to be approximately equal to the predetermined value. As a result, upon the precession frequency of the nuclear spin isotope(s) 16 being approximately equal to the predetermined value, the net magnetic field along the Z-axis is approximately equal to the value associated with the predetermined precession frequency of the nuclear spin isotopes, such that the DC component $B_{Z\_DC}$ of the magnetic field $B_Z$ arising from the feedback signal FDBK is approximately equal and opposite to the Z-axis component of the external magnetic field. The magnitude of the DC component $B_{Z\_DC}$ of the magnetic field $B_Z$ arising from the feedback signal FDBK corresponds directly to the vector magnitude of the external magnetic field in the Z-axis. The detection system 30 can thus control the DC component $B_{Z\_DC}$ of the magnetic field $B_Z$ to maintain the precession frequency of the nuclear spin isotope(s) 16 to be approximately equal to the predetermined value in a feedback manner, thus substantially constantly monitoring the magnitude of the Z-axis component of the external magnetic field. Accordingly, the magnetometer system 10 can implement NMR detection of the vector component of the external magnetic field in the Z-axis based on determining the precession frequency of the nuclear spin isotope(s) 16.

The vector magnitude of the external magnetic field in the Z-axis, along with the vector magnitudes of the X- and Y-axes, are provided to the controller 32 via the signal DET.

As an example, the controller 32 can store and/or substantially constantly update the values of the vector magnitudes of the external magnetic field in the respective X-, Y-, and Z-axes via the vector component 34. In addition, the controller 32 can calculate the scalar magnitude of the external magnetic field via the scalar component 36. As an example, the scalar component 36 can calculate a vector sum of the vector magnitudes of the external magnetic field in the respective X-, Y-, and Z-axes. As a result, the controller 32 can calculate both a vector magnitude and a scalar magnitude of an external magnetic field based on the implementation of EPR and NMR detection using a single sensor cell 12 in the magnetometer system 10. As a result, the magnetometer system 10 can combine the sensitivity of a whole field scalar magnetometer with the greater bandwidth and vector measurement capability of a set of vector magnetometers.

Figure 3:
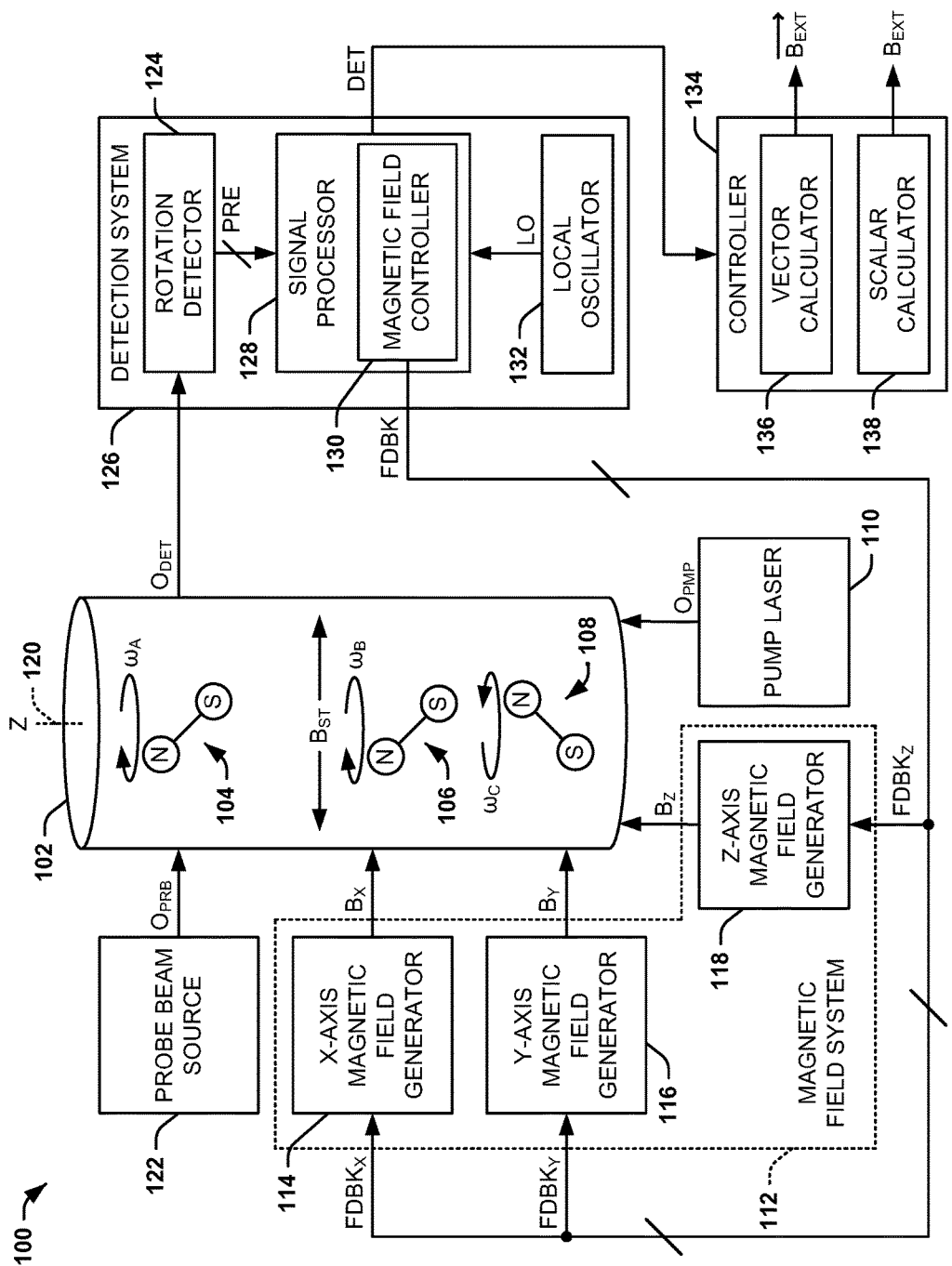
FIG. 3 illustrates another example of a magnetometer system in accordance with an aspect of the invention.

FIG. 3 illustrates another example of a magnetometer system 100 in accordance with an aspect of the invention. In the example of FIG. 3, the magnetometer system 100 can implement measurement characteristics of both an EPR magnetometer and an NMR magnetometer using a single sensor cell 102. The magnetometer system 100 can be implemented in any of a variety of applications that may require measurement of external and applied magnetic fields.

The sensor cell 102 can be, for example, a glass casing of any of a variety of shapes and sizes. The sensor cell 102 includes an alkali metal 104, a first nuclear spin isotope 106, and a second nuclear spin isotope 108. As an example, the alkali metal 104 can be Rb or Cs vapor. The nuclear spin isotopes 106 and 108 can be noble gas isotopes, such as $^{129}$Xe and $^{131}$Xe, respectively. The magnetometer system 100 includes a pump laser 110 that is configured to generate an optical pump beam $O_{PMP}$ that is directed through the sensor cell 102 via a set of optics to stimulate (i.e., excite) the particles of the alkali metal 104 to an excited state to polarize the alkali metal 104, and also to polarize the nuclear spin isotopes 106 and 108 in a spin-exchange process.

In the example of FIG. 3, the magnetometer system 100 includes a magnetic field system 112 that is configured to generate magnetic fields in each of three orthogonal axes. Specifically, the magnetic field system includes an X-axis magnetic field generator 114 that generates a magnetic field $B_X$, a Y-axis magnetic field generator 116 that generates a magnetic field $B_Y$, and a Z-axis magnetic field generator 118 that generates a magnetic field $B_Z$ along the Z-axis, demonstrated in the example of FIG. 3 at 120. As an example, the magnetic field $B_Z$ can be an AC magnetic field having a DC component (i.e., DC offset) in the Z-axis 120, which can be substantially collinear with the pump beam $O_{PMP}$, and the magnetic fields $B_X$ and $B_Y$ can each be DC magnetic fields, with one or both having an AC component, such as demonstrated in the example of FIG. 2. In response to the magnetic field $B_Z$ along the Z-axis 120, the particles of the alkali metal 104, as well as the nuclear spin isotopes 106 and 108 can precess in the sensor cell 102. In the example of FIG. 3, the alkali metal 104 precesses at a frequency that is indicated by $\omega_A$, the first nuclear spin isotope 106 precesses at a frequency that is indicated by $\omega_B$, and the second nuclear spin isotope 108 precesses at a frequency that is indicated by $\omega_C$. In the example of FIG. 3, the first and second nuclear spin isotopes 106 and 108 are demonstrated as precessing in opposite directions with respect to each other.

The precession of the particles of the alkali metal 104 can be about an axis that corresponds to a net DC magnetic field, including the external magnetic field which the magnetometer system 100 is configured to calculate. The magnetometer system 100 also includes a probe laser 122 configured to generate a probe beam $O_{PRB}$ that is directed through the sensor cell 102, such as approximately orthogonally with respect to the pump beam $O_{PMP}$ and the magnetic field $B_Z$. The probe beam exiting the sensor cell 102, demonstrated in the example of FIG. 3 as $O_{DET}$, can exhibit Faraday rotation that corresponds to the precession of the particles of the alkali metal 104. The probe beam $O_{DET}$ exiting the sensor cell 102 is provided to a polarization rotation detector 124 in a detection system 126 that is configured to determine the Faraday rotation of the probe beam $O_{DET}$, which can be indicative of the components of the net magnetic field in the X/Y plane.

The polarization rotation detector 124 can provide a signal PRE that can be associated with the Faraday rotation of the probe beam $O_{DET}$ to a signal processor 128. In the example of FIG. 3, the signal processor 128 includes a magnetic field controller 130 that is configured to provide a feedback signal FDBK to the magnetic field system 112. The feedback signal FDBK includes feedback components $FDBK_X$ and $FDBK_Y$ that command the respective X- and Y-axis magnetic field generators 114 and 116 to adjust the respective magnetic fields $B_X$ and $B_Y$ to substantially mitigate the Faraday rotation of the probe beam $O_{DET}$ in a feedback manner based on setting the components of the net magnetic field in the X/Y plane to approximately zero to align the net magnetic field to the Z-axis 120. Thus, the magnitudes of the magnetic fields $B_X$ and $B_Y$ correspond directly to the vector magnitudes of the external magnetic field in the respective X- and Y-axes in an equal and opposite manner. Accordingly, the magnetometer system 100 can implement EPR detection of the vector components of the external magnetic field in the X- and Y-axes based on determining characteristics of the precession of the particles of the alkali metal 104.

Upon aligning the net magnetic field to the Z-axis 120 based on negating the components of the external magnetic field in the X- and Y-axes via the magnetic fields $B_X$ and $B_Y$, the Z-axis magnetic field generator 118 can be configured to adjust a magnitude of the DC component of the magnetic field $B_Z$ to determine the magnitude of the external magnetic field in the Z-axis 120. For example, similar to as described previously regarding the example of FIG. 2, at least one of the magnetic fields $B_X$ and $B_Y$ can include an AC component having frequencies that are approximately equal to Larmor precession frequencies of the nuclear spin isotopes 106 and 108, such that the nuclear spin isotopes 106 and 108 can be caused to precess. In response, an AC magnetic field BST is generated internal to the sensor cell 102. The internal magnetic field $B_{ST}$ can thus stimulate precession of the particles of the alkali metal 104 with an amplitude modulation at approximately the Larmor precession frequencies of the nuclear spin isotopes 106 and 108. As a result, the probe beam $O_{DET}$ exiting the sensor cell 102 can include a Faraday rotation that corresponds in part to the precession of the alkali metal 104 at the Larmor precession frequencies of the nuclear spin isotopes 106 and 108. The precession of the nuclear spin isotopes 106 and 108, and thus the particles of the alkali metal 104, can also be dependent on the magnitude of the vector component of the net magnetic field in the Z-axis 120. The detection system 126 can thus be configured to monitor the precession of the nuclear spin isotopes 106 and 108 based on the probe beam $O_{DET}$ exiting the sensor cell 102 as a result of the interaction of the probe beam $O_{PRB}$ with the alkali metal 104 to determine a magnitude of the net magnetic field in the Z-axis 120.

In the example of FIG. 3, the detection system 126 includes a local oscillator 132 that is configured to generate a reference signal LO. The reference signal LO can correspond to a substantially stable frequency reference signal, such as corresponding to a predetermined magnitude of an external magnetic field along the Z-axis 120. Therefore, a deviation of the combined precession frequency of the nuclear spin isotopes 106 and 108 from the reference signal LO can be indicative of a magnitude and direction of the external magnetic field along the Z-axis 120. In addition, because the nuclear spin isotopes 106 and 108 precess in opposite directions in response to the magnetic field $B_Z$, the precession frequencies of the nuclear spin isotopes 106 and 108 are affected equally and oppositely in response to rotation of the sensor magnetometer system 100. Accordingly, the signal processor 128 can be configured to compare a sum of the precession frequencies $\omega_B$ and $\omega_C$ of the nuclear spin isotopes 106 and 108 with the reference signal LO to determine the magnitude of the external magnetic field along the Z-axis 120. As such, the determination of the magnitude of the external magnetic field along the Z-axis 120 can be insensitive to rotation of the magnetometer system 100 about the Z-axis 120.

In response to the comparison of the sum of the precession frequencies $\omega_B$ and $\omega_C$ with the reference signal LO, the signal processor 128 can determine an error between the values. The magnetic field controller 130 can thus adjust a magnitude of the DC component $B_{Z\_DC}$ of the magnetic field $B_Z$ via a feedback component $FDBK_Z$ of the signal FDBK to shift the sum of the precession frequencies $\omega_B$ and $\omega_C$ of the nuclear spin isotopes 106 and 108 to be approximately equal to the reference signal LO. As a result, upon the sum of the precession frequencies $\omega_B$ and $\omega_C$ of the nuclear spin isotopes 106 and 108 being approximately equal to the reference signal LO, the net magnetic field along the Z-axis 120 is approximately equal to the value associated with the predetermined precession frequency, such that the DC component $B_{Z\_DC}$ of the magnetic field $B_Z$ arising from the feedback signal FDBK is approximately equal and opposite to the Z-axis component of the external magnetic field. The magnitude of the DC component $B_{Z\_DC}$ of the magnetic field $B_Z$ arising from the feedback signal FDBK corresponds directly to the vector magnitude of the external magnetic field in the Z-axis 120. The detection system 126 can thus control the DC component $B_{Z\_DC}$ of the magnetic field $B_Z$ to maintain the sum of the precession frequencies $\omega_B$ and $\omega_C$ of the nuclear spin isotopes 106 and 108 to be approximately equal to the reference signal LO in a feedback manner, thus substantially constantly monitoring the magnitude of the Z-axis component of the external magnetic field. Accordingly, the magnetometer system 100 can implement NMR detection of the vector component of the external magnetic field in the Z-axis 120 based on determining the sum of the precession frequencies $\omega_B$ and $\omega_C$ of the nuclear spin isotopes 106 and 108.

Upon determining the vector components of the external magnetic field in each of the X-, Y-, and Z-axes in the respective EPR and NMR detection implementations, the signal processor 128 can provide the values of the vector components to a controller 134 via the signal DET. As an example, the controller 134 can store and/or substantially constantly update the values of the vector magnitudes of the external magnetic field in the respective X-, Y-, and Z-axes via a vector component 136. In addition, the controller 134 can calculate the scalar magnitude of the external magnetic field via a scalar component 136, such as based on a vector sum of the vector magnitudes of the external magnetic field in the respective X-, Y-, and Z-axes. As a result, the controller 134 can calculate both a vector magnitude and a scalar magnitude $B_{EXT}$ of an external magnetic field based on the implementation of EPR and NMR detection using a single sensor cell 102 in the magnetometer system 100. As a result, the magnetometer system 100 can combine the rotation stability and sensitivity of a whole field scalar magnetometer with the greater bandwidth and vector measurement capability of a set of vector magnetometers.

Figure 4:
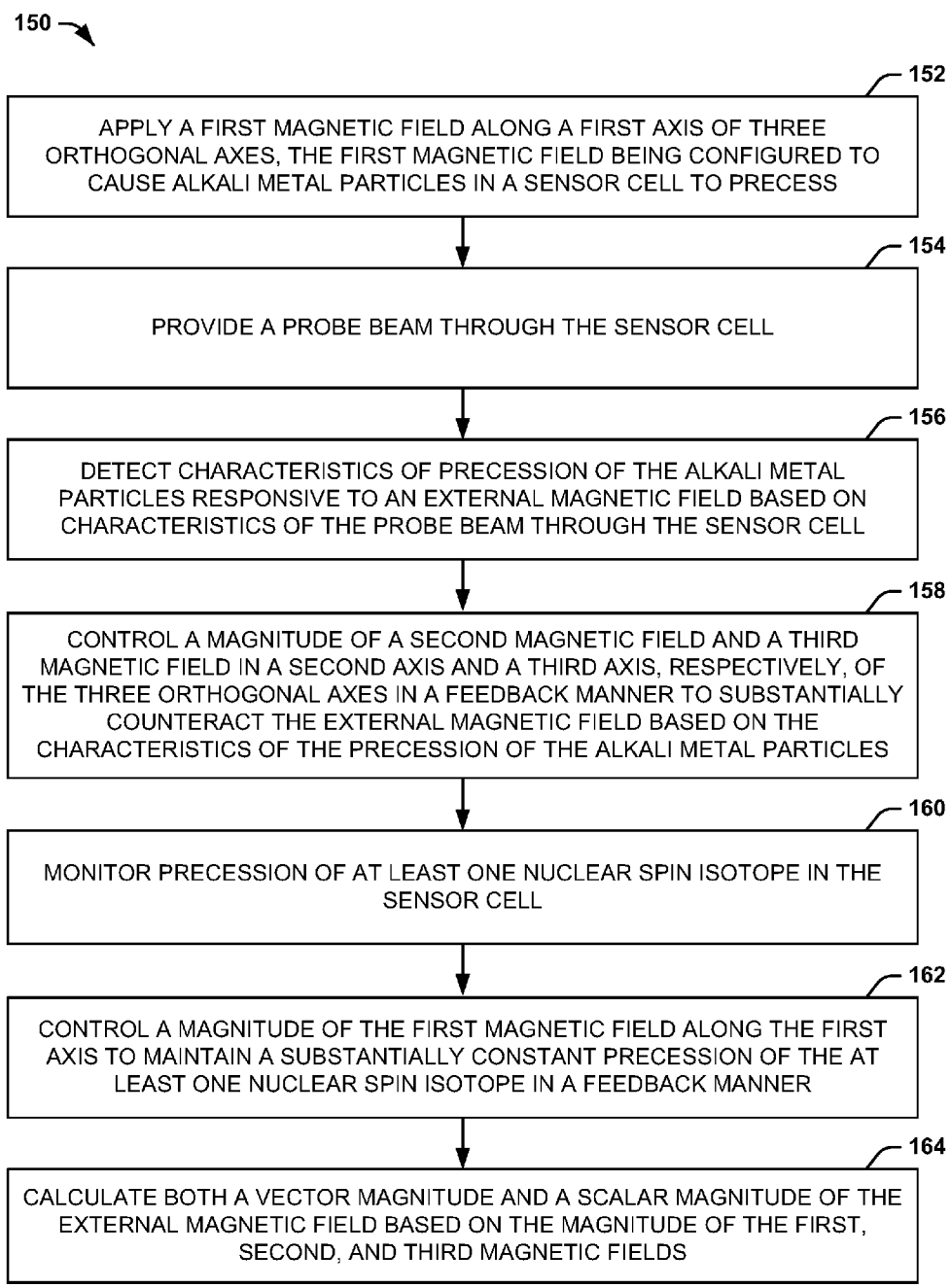
FIG. 4 illustrates an example of a method for measuring both a scalar magnitude and a vector magnitude of an external magnetic field in three orthogonal axes in accordance with an aspect of the invention.

In view of the foregoing structural and functional features described above, a methodology in accordance with various aspects of the present invention will be better appreciated with reference to FIG. 4. While, for purposes of simplicity of explanation, the methodology of FIG. 4 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 4 illustrates an example of a method 150 for measuring both a scalar magnitude and a vector magnitude of an external magnetic field in three orthogonal axes in accordance with an aspect of the invention. At 152, a first magnetic field is applied along a first axis of three orthogonal axes, the first magnetic field being configured to cause alkali metal particles in a sensor cell to precess. The first axis could be a Z-axis, and the first magnetic field can have both an AC and a DC component. At 154, a probe beam is provided through the sensor cell. The probe beam can be a linearly-polarized beam. At 156, characteristics of precession of the alkali metal particles responsive to an external magnetic field can be determined based on characteristics of the probe beam through the sensor cell. The characteristics of precession can correspond to an angle of precession off-axis from the Z-axis, such as can be identified based on a Faraday rotation of the probe beam exiting the sensor cell. At 158, a magnitude of a second magnetic field and a third magnetic field in a second axis and a third axis, respectively, of the three orthogonal axes is controlled in a feedback manner to substantially counteract the external magnetic field based on the characteristics of the precession of the alkali metal particles. The second and third magnetic fields can be DC components in the respective X- and Y-axes to align the external magnetic field in the Z-axis in an EPR manner.

At 160, precession of at least one nuclear spin isotope in the sensor cell is monitored. The precession can be based on an applied AC magnetic field component in one or both of the X- and Y-axes to stimulate precession of the nuclear spin isotope(s) which are nuclear spin-polarized based on a spin-exchange of the alkali metal having been stimulated by a pump beam. The precession can be monitored based on a Faraday rotation of the probe beam at approximately the Larmor precession frequency of the nuclear spin isotope(s) based on an induced internal magnetic field affecting the alkali metal. At 162, a magnitude of the first magnetic field along the first axis is controlled to maintain a substantially constant precession of the at least one nuclear spin isotope in a feedback manner. The controlling of the magnitude of the first magnetic field can be based on comparing the precession frequency of the nuclear spin isotope(s) to a predetermined frequency reference to substantially nullify the component of the external magnetic field in the Z-axis in an NMR manner. At 164, both a vector magnitude and a scalar magnitude of the external magnetic field are calculated based on the magnitude of the first, second, and third magnetic fields. The vector magnitude can correspond to the magnitudes of the applied magnetic fields in the X-, Y-, and Z-axes, and the scalar magnitude can be based on a vector sum of the applied magnetic fields in the X-, Y-, and Z-axes.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A magnetometer system comprising:
    a sensor cell comprising alkali metal particles;
    a probe laser configured to provide a probe beam through the sensor cell;
    a detection system configured to implement nuclear magnetic resonance (NMR) detection of a vector magnitude of an external magnetic field in a first axis based on characteristics of the probe beam passing through the sensor cell and to implement electron paramagnetic resonance (EPR) detection of a vector magnitude of the external magnetic field in a second axis based on the characteristics of the probe beam passing through the sensor cell; and
    a controller configured to calculate a scalar magnitude of the external magnetic field based on the detected magnitude of the external magnetic field in each of the first and second axes.

2. The system of claim 1, further comprising a magnetic field system configured to generate a controllable magnetic field in each of the first and second axes through the sensor cell, wherein the detection system is configured to detect characteristics of precession of the alkali metal particles responsive to the external magnetic field based on the characteristics of the probe beam and to control a magnitude of the controllable magnetic field in each of the first and second axes in a feedback manner to substantially counteract the external magnetic field based on the characteristics of the precession of the alkali metal particles, and wherein the controller is configured to calculate both the scalar magnitude and the vector magnitude of the external magnetic field in each of the first and second axes based on the magnitude of the controllable magnetic field in each of the first and second axes.

3. The system of claim 2, wherein the first and second axes are orthogonal with respect to each other, wherein the detection system is configured to detect a vector magnitude of the external magnetic field in each of the two orthogonal first and second axes based on setting the controllable magnetic field in each of the two orthogonal first and second axes to substantially mitigate a Faraday rotation associated with the probe beam through the sensor cell.

4. The system of claim 1, wherein the probe laser is configured to generate the probe beam as a linearly polarized optical signal, and wherein the detection system is configured to detect the precession of the alkali metal particles based on a Faraday rotation of the linearly-polarized optical signal in each of the EPR detection and the NMR detection.

5. The system of claim 1, wherein the sensor cell further comprises at least one nuclear spin isotope, the system further comprising a pump laser configured to generate an optical pump beam configured to stimulate the alkali metal particles to allow the detection of the precession of the at least one nuclear spin isotope, the detection system being further configured to detect the precession of the at least one nuclear spin isotope to determine a vector magnitude of the external magnetic field in the first axis in the NMR detection.

6. The system of claim 5, wherein the at least one nuclear spin isotope comprises a first nuclear spin isotope and a second nuclear spin isotope, the first and second nuclear spin isotopes having gyromagnetic ratios such that the first and second nuclear spin isotopes precess in opposite directions, wherein the detection system is configured to compare a sum of precession frequencies of the first and second nuclear spin isotopes with a substantially stable reference frequency to determine the vector magnitude of the external magnetic field in the first axis.

7. The system of claim 6, wherein the magnetic field system is configured to generate the controllable magnetic field in the first axis having a DC component that is controllable to substantially set the sum of the precession frequencies of the first and second nuclear spin isotopes substantially equal to the substantially stable reference frequency to determine the vector magnitude of the external magnetic field in the first axis.

8. The system of claim 5, wherein the magnetic field system is configured to generate the controllable magnetic field in the second axis having an AC component to stimulate the precession of the at least one nuclear spin isotope.

9. A method for measuring both a scalar magnitude and a vector magnitude of an external magnetic field, the method comprising:
    applying a first magnetic field along a first axis, the first magnetic field being configured to cause alkali metal particles in a sensor cell to precess;
    applying a second magnetic field along a second axis that is orthogonal with the first axis;
    monitoring precession of at least one nuclear spin isotope in the sensor cell that is responsive to the precession of the alkali metal particles;
    controlling a magnitude of the first and second magnetic fields based on the precession of the at least one nuclear spin isotope in a feedback manner; and
    calculating both a vector magnitude and a scalar magnitude of the external magnetic field based on the magnitude of the first and second magnetic fields.

10. The method of claim 9, wherein controlling the magnitude of the first and second magnetic fields comprises controlling a magnitude of the second magnetic field along the second axis in the feedback manner to substantially counteract the external magnetic field based on the characteristics of the precession of the alkali metal particles.

11. The method of claim 9, wherein controlling the magnitude of the first and second magnetic fields comprises controlling the magnitude of the first magnetic field along the first axis to maintain a substantially constant precession of the at least one nuclear spin isotope in the feedback manner.

12. The method of claim 11, wherein the at least one nuclear spin isotope comprises a first nuclear spin isotope and a second nuclear spin isotope, wherein monitoring the precession comprises comparing a sum of precession frequencies of the first and second nuclear spin isotopes with a substantially stable reference frequency to determine the vector magnitude of the external magnetic field in the first axis, wherein controlling a magnitude of the first and second magnetic fields comprises controlling a DC component of the first magnetic field to substantially set the sum of the precession frequencies of the first and second nuclear spin isotopes substantially equal to the substantially stable reference frequency to determine the vector magnitude of the external magnetic field in the first axis.

13. A magnetometer system comprising:
a sensor cell comprising alkali metal particles;
a probe laser configured to provide a probe beam through the sensor cell;
a pump laser configured to generate an optical pump beam configured to stimulate the alkali metal particles;
a magnetic field system configured to generate a controllable magnetic field in each of two axes through the sensor cell;
a detection system configured to detect characteristics of precession of the stimulated alkali metal particles responsive to an external magnetic field based on the probe beam and to control a magnitude of the controllable magnetic field in each of the two axes to substantially counteract the external magnetic field based on the characteristics of the precession of the stimulated alkali metal particles; and
a controller configured to calculate a magnitude of the external magnetic field based on the magnitude of the controllable magnetic field in each of the two axes.

14. The system of claim 13, wherein the controller is configured to calculate the magnitude of the external magnetic field as a vector magnitude in each of the two axes based on the magnitude of the controllable magnetic field in each of the two axes, and to calculate a scalar magnitude of the external magnetic field based on a vector sum of the vector magnitude of the external magnetic field in each of the two axes.

15. The system of claim 13, wherein the probe laser is configured to generate the probe beam as a linearly polarized optical signal, and wherein the detection system is configured to detect the precession of the stimulated alkali metal particles based on a Faraday rotation of the linearly-polarized optical signal.

16. The system of claim 13, wherein the sensor cell further comprises at least one nuclear spin isotope which is spin-polarized through interaction with the stimulated alkali metal particles and precess(es) in response to the net magnetic field, the detection system being further configured to detect the precession of the at least one nuclear spin isotope to determine a vector magnitude of the external magnetic field in a first of the two axes.

17. The system of claim 16, wherein the at least one nuclear spin isotope comprises a first nuclear spin isotope and a second nuclear spin isotope, the first and second nuclear spin isotopes having gyromagnetic ratios such that the first and second nuclear spin isotopes precess in opposite directions, wherein the detection system is configured to compare a sum of precession frequencies of the first and second nuclear spin isotopes with a substantially stable reference frequency to determine the vector magnitude of the external magnetic field in the first of the two axes.

18. The system of claim 17, wherein the first and second axes are orthogonal with respect to each other, wherein the magnetic field system is configured to generate the controllable magnetic field in the first of the two orthogonal axes having a DC component that is controllable to substantially set the sum of the precession frequencies of the first and second nuclear spin isotopes substantially equal to the substantially stable reference frequency to determine the vector magnitude of the external magnetic field in the first of the two orthogonal axes.

19. The system of claim 16, wherein the magnetic field system is configured to generate the controllable magnetic field in a second of the two axes having an AC component to stimulate the precession of the at least one nuclear spin isotope.

20. The system of claim 13, wherein the detection system is configured to detect a vector magnitude of the external magnetic field in one of the two axes based on setting the controllable magnetic field in one of the two axes to substantially mitigate a Faraday rotation associated with the probe beam through the sensor cell.

* * * * *